US 8,698,388 B2

United States Patent
Cash (10) Patent No.: US 8,698,388 B2
(45) Date of Patent: Apr. 15, 2014

(54) LIGHTING APPARATUS PROVIDING INCREASED LUMINOUS FLUX WHILE MAINTAINING COLOR POINT AND CRI

(75) Inventor: Mark Charles Cash, Raleigh, NC (US)

(73) Assignee: Cree, Inc., Durham, NC (US)

( * ) Notice: Subject to any disclaimer, the term of this patent is extended or adjusted under 35 U.S.C. 154(b) by 341 days.

(21) Appl. No.: 13/042,959

(22) Filed: Mar. 8, 2011

(65) Prior Publication Data
US 2012/0201025 A1 Aug. 9, 2012

Related U.S. Application Data

(60) Provisional application No. 61/439,224, filed on Feb. 3, 2011.

(51) Int. Cl.
*H05B 33/00* (2006.01)

(52) U.S. Cl.
USPC ............................ 313/501; 362/231

(58) Field of Classification Search
USPC ................... 313/498, 501; 362/231
See application file for complete search history.

(56) References Cited

U.S. PATENT DOCUMENTS

| 6,853,010 | B2 | 2/2005 | Slater, Jr. et al. |
| 7,213,940 | B1 | 5/2007 | Van De Ven et al. |
| 7,821,194 | B2 | 10/2010 | Negley et al. |
| 2006/0028122 | A1* | 2/2006 | Wang et al. ............ 313/503 |
| 2010/0001648 | A1* | 1/2010 | De Clercq et al. ........ 315/113 |
| 2010/0118510 | A1* | 5/2010 | Bailey et al. ............ 362/84 |
| 2011/0012141 | A1 | 1/2011 | Le Toquin et al. |

* cited by examiner

*Primary Examiner* — Andrew Coughlin
(74) *Attorney, Agent, or Firm* — Myers Bigel Sibley & Sajovec (57) ABSTRACT

A lighting module includes a plurality of solid state light emitting components configured to collectively emit light having a desired white point and a color rendering index (CRI) of greater than about 90. The module further includes at least one additional solid state light emitting component configured to individually emit light having a white point substantially similar to the desired white point. The at least one additional light emitting component may increase a lumen output of the lighting module without substantially altering the desired white point of the light collectively emitted by the plurality of light emitting components.

28 Claims, 6 Drawing Sheets

Photographs of 4000K Modules: BSY+RDO (A) and BSY+RDO+NW (B)

LIGHTING APPARATUS PROVIDING INCREASED LUMINOUS FLUX WHILE MAINTAINING COLOR POINT AND CRI

CLAIM OF PRIORITY

The present application claims priority from U.S. Provisional Patent Application Ser. No. 61/439,224, filed Feb. 3, 2011, the disclosure of which is hereby incorporated by reference herein in its entirety.

FIELD

The present invention relates to semiconductor light emitting devices, and more particularly, to lighting apparatus including semiconductor light emitting devices.

BACKGROUND

Light emitting diodes and laser diodes are well known solid state lighting elements capable of generating light upon application of a sufficient current. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). The substrate may be removed and/or replaced by another substrate in some instances. In order to facilitate the application of a current to the device, an anode contact may be formed on a p-type region of the device (typically, an exposed p-type epitaxial layer) and a cathode contact may be formed on an n-type region of the device (such as the substrate or an exposed n-type epitaxial layer). When a potential is applied to the ohmic contacts, electrons may be injected into an active region from the n-type layer and holes may be injected into the active region from the p-type layer. The radiative recombination of electrons and holes within the active region generates light. Some LED chips include an active region with multiple light emitting regions or active layers (also known as multi-quantum-well structures) between or near the junction of the n-type and p-type layers.

LEDs may be used in lighting/general illumination applications, for example, as a replacement for conventional incandescent and/or fluorescent lighting. As such, it is often desirable to provide a lighting source that generates white light having a relatively high color rendering index (CRI), so that objects illuminated by the lighting may appear more natural. The color rendering index of a light source is an objective measure of the ability of the light generated by the source to accurately illuminate a broad range of colors. In particular, CRI is a relative measurement of how the color rendering properties of an illumination system compare to those of a black-body radiator. A CRI of 100 indicates that the color coordinates of a set of test colors being illuminated by the illumination system are the same as the coordinates of the same test colors being irradiated by the black-body radiator. The color rendering index ranges from essentially zero for monochromatic sources to nearly 100 for incandescent sources. For example, daylight has the highest CRI (of 100), with incandescent bulbs being relatively close (about 95), and fluorescent lighting being less accurate (70-85).

In addition, the chromaticity of a particular light source may be referred to as the "color point" of the source. The color point may be defined with reference to a set of tristimulus values (X, Y, Z) and/or color coordinates (CCx, CCy) on a chromaticity diagram. For a white light source, the chromaticity may be referred to as the "white point" of the source. The white point of a white light source may fall along a locus of chromaticity points corresponding to the color of light emitted by a black-body radiator (also referred to herein as a "black body locus") heated to a given temperature. The black-body locus is also referred to as the "Planckian" locus because the chromaticity coordinates (i.e., color points) that lie along the black-body locus obey Planck's equation: $E(\lambda)=A\lambda^{-5}/(e^{B/T}-1)$, where E is the emission intensity, $\lambda$ is the emission wavelength, T is the color temperature of the black-body and A and B are constants. Accordingly, a white point may be identified by a correlated color temperature (CCT) of the light source, which is the temperature at which the heated black-body radiator matches the color or hue of the white light source. White light typically has a CCT of between about 4000 degrees Kelvin (K) and 8000K. White light with a CCT of 4000 has a yellowish color. White light with a CCT of 8000K is more bluish in color, and may be referred to as "cool white." "Warm white" may be used to describe white light with a CCT of between about 2600K and 3700K, which is more reddish in color. "Neutral white" may refer to white light with a CCT of between about 3700K and 5000K.

The light from a single-color LED may be converted to white light by surrounding the LED with a wavelength conversion material, such as a phosphor. The term "phosphor" may be used herein to refer to any materials that absorb light in one wavelength range and re-emit light in a different wavelength range, regardless of the delay between absorption and re-emission and regardless of the wavelengths involved. A fraction of the light may also pass through the phosphor and/or be reemitted from the phosphor at essentially the same wavelength as the incident light, experiencing little or no wavelength conversion. In general, phosphors absorb light having shorter wavelengths and re-emit light having longer wavelengths. As such, some or all of the light emitted by the LED at a first wavelength may be absorbed by the phosphor particles, which may responsively emit light at a second wavelength. For example, a single blue-emitting LED may be surrounded with a yellow-emitting phosphor (such as cerium-doped yttrium aluminum garnet (YAG)), referred to herein as a blue shifted yellow (BSY) LED. The resulting light, which is a combination of blue light and yellow light, may appear white to an observer.

However, the light generated from a phosphor-based solid state lighting component including a blue-emitting LED and a yellow-emitting phosphor may have a relatively low CRI. As such, objects illuminated by the light from such a component may not appear to have natural coloring due to the limited spectrum of the light. While the CRI may be improved by including a red-emitting element, such as a red-emitting LED and/or a red-emitting phosphor, difficulties may arise in balancing the color point, CRI, and lumen output of a lighting module or apparatus including such lighting components.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the disclosure.

According to some embodiments, a lighting module includes a plurality of solid state light emitting components configured to provide collective light emission having first and second characteristics, and at least one additional solid state light emitting component configured to provide individual light emission over a wavelength range different than that of respective ones of the plurality of solid state light emitting components. The individual light emission in combination with the collective light emission defines an overall light emission of the module in which the second characteristic is altered while the first characteristic is substantially maintained.

In some embodiments, the first characteristic may be a desired color point, and the second characteristic may be a lumen output or a color rendering index (CRI).

In some embodiments, the individual light emission may have a color point that is substantially similar to the desired color point. For example, respective color coordinates defining the white point of the individual emission may be equal those defining the desired color point up to at least a third decimal place.

In some embodiments, the desired color point may be a white point on a Planckian locus having a correlated color temperature between about 2600 K and about 6500 K.

In some embodiments, respective color coordinates defining a white point of the overall light emission may fall within a 4-step MacAdam ellipse centered around the desired white point.

In some embodiments, a color rendering index (CRI) of the collective light emission may be greater than about 90. Also, a CRI of the overall light emission may be less than the CRI of the collective light emission, but may be greater than about 90.

In some embodiments, the plurality of solid state light emitting components may include first and second light emitting devices configured to provide light emission over different first and second wavelength ranges, respectively. The additional solid state light emitting component may be a third light emitting device configured to provide the individual light emission over a third wavelength range different than the first and second wavelength ranges.

In some embodiments, the first light emitting device may be a blue shifted yellow light emitting device, the second light emitting device may be a red light emitting device, and the third light emitting device may be a warm-white or neutral-white light emitting device. For example, the third light emitting device may include a blue-emitting LED and at least one wavelength conversion material that emits light having a wavelength within the yellow to red portions of a visible spectrum.

In some embodiments, the third light emitting device may be a neutral-white light emitting device. The individual light emission of the neutral-white light emitting device may define a spectral distribution having a first peak wavelength between about 440 nanometers (nm) and 460 nm, and a second peak wavelength between about 560 nm and about 599 nm. For example, the spectral distribution for the neutral-white light emitting device may have a first peak wavelength at about 445 nm, and may have a second peak wavelength at about 580 nm.

In some embodiments, the third light emitting device may be a warm-white light emitting device. The individual light emission of the warm-white light emitting device may define a spectral distribution having a first peak wavelength between about 445 nanometers (nm) and about 465 nm, and a second peak wavelength between about 580 nm and about 620 nm. For example, the spectral distribution for the warm-white light emitting device may have a first peak wavelength at about 455 nm, and may have a second peak wavelength at about 605 nm.

In some embodiments, the third light emitting device may be positioned in the module substantially diagonal to the second light emitting device in plan view.

In some embodiments, a ratio of the first light emitting device to the second light emitting device included in the module is about 5:2 or about 5:3. A quantity of the third light emitting device included in the module may be independent of the ratio of the first emitting device to the second light emitting device.

In some embodiments, the plurality of solid state light emitting components and the at least one additional solid state light emitting component may be serially connected.

In some embodiments, the module may further include a control circuit. The control circuit may include a constant current source that is operable to drive the plurality of solid state light emitting components and the at least one additional solid state light emitting component.

According to further embodiments, a lighting module includes a plurality of solid state light emitting components configured to collectively emit light having a desired white point and a color rendering index (CRI) of greater than about 90. The module further includes at least one additional solid state light emitting component configured to individually emit light having a white point substantially similar to the desired white point. The at least one additional light emitting component is configured to increase a lumen output of the lighting module without substantially altering the desired white point of the light collectively emitted by the plurality of light emitting components.

In some embodiments, the at least one additional light emitting component may include one or more warm-white light emitting diodes (LEDs) configured to emit light having a correlated color temperature (CCT) of about 2700 K to about 4000 K. The plurality of light emitting components may include one or more blue-emitting LEDs surrounded with a yellow phosphor, and one or more red- or orange-emitting LEDs.

According to still further embodiments, a lighting apparatus includes a plurality of solid state light emitting components configured to provide collective light emission having a desired white point. The plurality of solid state light emitting components includes first and second solid state light emitting components configured to provide respective light emission over different wavelength ranges. The lighting apparatus further includes at least one third solid state light emitting component configured to provide individual light emission over a wavelength range different than the first and second light emitting components. The individual light emission in combination with the collective light emission increases an overall lumen output of the lighting apparatus without substantially altering the desired white point.

According to yet further embodiments, a lighting module includes a plurality of blue shifted yellow light emitting devices and red light emitting devices configured collectively emit light having a desired white point. The lighting module further includes at least one warm-white or neutral-white light emitting device configured to individually emit light having a white point substantially similar to the desired white point to increase a luminous flux of an overall light output of the lighting module without substantially altering the desired white point.

Although described above primarily with respect to apparatus aspects, it will be understood that the present invention may be embodied as other methods, circuits, and/or electronic devices, and that such embodiments will be or become apparent to one with skill in the art upon review of the following drawings and detailed description. It is intended that all such additional methods, circuits, and/or electronic devices, as well as any combinations of the above embodiments, be included within this description and be protected by the accompanying claims.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

As used herein, a "solid state light emitting component" or "semiconductor light emitting device" may include a light emitting diode (LED) and/or other light emitting device which includes one or more semiconductor layers such as silicon, silicon carbide, gallium nitride, and/or other semiconductor materials. A light emitting device may or may not include a substrate such as a sapphire, silicon, silicon carbide, gallium nitride, and/or other microelectronic substrates. A light emitting device may include one or more contact layers which may include metal and/or other conductive layers. The design and fabrication of semiconductor light emitting devices are well known to those having skill in the art and need not be described in detail herein. For example, the semiconductor light emitting device may be gallium nitride-based LEDs fabricated on a silicon carbide substrate such as those devices manufactured and sold by Cree, Inc. of Durham, N.C.

Furthermore, phosphor coated light emitting diodes, such as those described in U.S. Pat. No. 6,853,010, entitled "Phosphor-Coated Light Emitting Diodes Including Tapered Sidewalls and Fabrication Methods Therefor," may also be suitable for use in embodiments of the present invention. The term "phosphor" may be used herein to refer to any materials that absorb light at one wavelength and re-emit light at a different wavelength, regardless of the delay between absorption and re-emission and regardless of the wavelengths involved. Accordingly, the term "phosphor" may refer to wavelength conversion materials that are sometimes called fluorescent and/or phosphorescent. In general, phosphors absorb light of shorter wavelengths and re-emit light of longer wavelengths. As such, some or all of the excitation light emitted by an LED chip at a first wavelength may be absorbed by the phosphor particles, which may responsively emit light at a second wavelength. A fraction of the light may also be reemitted from the phosphor at essentially the same wavelength as the incident light, experiencing little or no down-conversion.

Also, semiconductor nanoparticles, or "quantum dots" (such as ZnS, ZnSe, CdS, and CdSe), may be used as wavelength conversion materials in some embodiments. Quantum dots may offer potential advantages over conventional phosphors as luminescent wavelength-converting materials. For example, the emission spectra of quantum dots can be "tuned" by altering particle size distribution and/or surface chemistry, in contrast to phosphors, where the emission spectra may be fixed by nature. Thus, the term "wavelength conversion material" may be generally used herein to refer to any material or layer containing phosphors, quantum dots, and/or any other material that receives light at one wavelength and responsively re-emits light at a different wavelength.

Also, as used herein, the "efficiency" of a wavelength conversion material may refer to the ratio of the photon output of the material (at any wavelength) relative to the photon input to the material, for example, as provided from an LED chip. In contrast, the "efficacy" of a packaged LED (also referred to herein as a "lighting component" or "component") may refer to the ratio of the overall light output by the LED to the electrical power input to the LED (e.g., in lumens per Watt), which may be affected by the efficiency of any wavelength conversion materials that may be included in the packaged LED. Furthermore, when a light emitting component (such as an LED, an LED chip, or a wavelength conversion material) is described herein as emitting light with reference to a particular color, it will be understood that the light emitting component emits light having a wavelength that falls within a wavelength range associated with the recited color.

A lighting apparatus according to some embodiments of the present invention may include light emitting devices used in combination with other color emitters to produce light of a desired chromaticity, correlated color temperature (CCT), color rendering index (CRI), luminous flux (also referred to herein as lumen output, expressed in lumens), and/or other characteristics. For example, LED devices that include a combination of a blue excitation diode and a phosphor are described in U.S. Pat. No. 7,213,940, issued May 8, 2007, and entitled "LIGHTING DEVICE AND LIGHTING METHOD," the disclosure of which is incorporated herein by reference. As described therein, a lighting device may include a solid state light emitter (i.e., a LED chip) which emits light having dominant wavelength in ranges of from about 430 nanometers (nm) to about 480 nm (e.g., in the blue portion of the visible spectrum), and a phosphor which emits light having dominant wavelength in the range of from 555 nm to 585 nm (e.g., in the yellow portion of the visible spectrum). As white light can be perceived from a mixture of light of many different wavelengths, a combination of light emitted by the blue emitter and light responsively emitted by the yellow phosphor may produce a sub-mixture of light that appears nearly white to an observer. Such a LED is referred to herein as "blue shifted yellow" or "BSY" LED. This near-white light may, when combined with red light having a dominant wavelength from 600 nm to 630 nm (e.g., in the red portion of the visible spectrum), produce an appearance of "warm white" light, as discussed for example in U.S. Pat. No. 7,821,194, issued Oct. 26, 2010 and entitled "SOLID STATE LIGHTING DEVICES INCLUDING LIGHT MIXTURES," the disclosure of which is incorporate herein by reference.

Some embodiments of the present invention may arise from realization that, in a lighting module that includes blue shifted yellow (BSY) LEDs and red or red-orange (RDO) LEDs, the ratio of BSY luminous flux to RDO luminous flux may be limited to achieve certain correlated color temperatures (CCTs), especially in modules containing fewer numbers of LEDs. For example, while a desired color point and CRI may be achieved for certain CCTs, it may also be desirable to increase the overall luminous flux or lumen output of the lighting module. However, reaching a desired lumen output while being within the desired color bins may not be easily be accomplished, as altering the BSY to RDO ratios to increase the lumen output may result in a color point outside the desired color bins.

In light of these difficulties, some embodiments of the present invention further include a warm white (WW) or neutral white-emitting LED that provides light output having a white point that is substantially similar to the desired final or overall white point for the lighting module. As used herein, a "white point" refers to the color point of a white light source, which may be expressed with reference to color coordinates (CCx, CCy) and/or a correlated color temperature (CCT). The addition of the warm white LED (which emits light having a CCT of about 2600 K to about 3700 K) or neutral white LED (which emits light having a CCT of about 3700 K to about 5000 K) may raise the overall luminous flux of the lighting module to achieve a desired flux level, while substantially maintaining the existing white point. In some embodiments, the addition of the warm white or neutral white LED may increase the overall luminous flux without significantly reducing the CRI and/or while maintaining the CRI above a desired level.

Particular embodiments of the present invention provide a lighting module or apparatus including a plurality of blue shifted yellow (BSY) LEDs and red-orange (RDO) LEDs at a particular ratio of BSY:RDO to achieve a desired color point, and at least one warm white or neutral white LED. The warm white or neutral white LED may be implemented by adding a phosphor that emits light between and/or including the yellow and red wavelength ranges to a BSY LED. In some embodiments, all of the LEDs may be serially connected in a single string, and may be controlled by constant current supplied by a control circuit. The number/quantity of warm white or neutral white LEDs that are included in the module may be selected based on the desired lumen output. Also, the white point of the warm white or neutral white LED(s) may correspond to the desired white point for the lighting module. For example, a warm-white lighting module may include one or more warm-white LEDs configured to individually emit light having a CCT of about 2700 K to about 3700 K in some embodiments. Likewise, a neutral-white lighting module may include one or more neutral-white LEDs configured to individually emit light having a CCT of about 3700 K to about 5000 K.

Embodiments of the present invention may differ from TrueWhite technology (which includes a lighting module having BSY and RDO LEDs) by further including at least one warm white LED in combination with the unsaturated BSY LEDs and saturated RDO LEDs. In situations where a desired color point has been achieved, but the luminous flux is lower than a desired specification, the addition of the warm white LED can increase the overall output flux of the module without substantially altering the existing color point.

Figure 1:
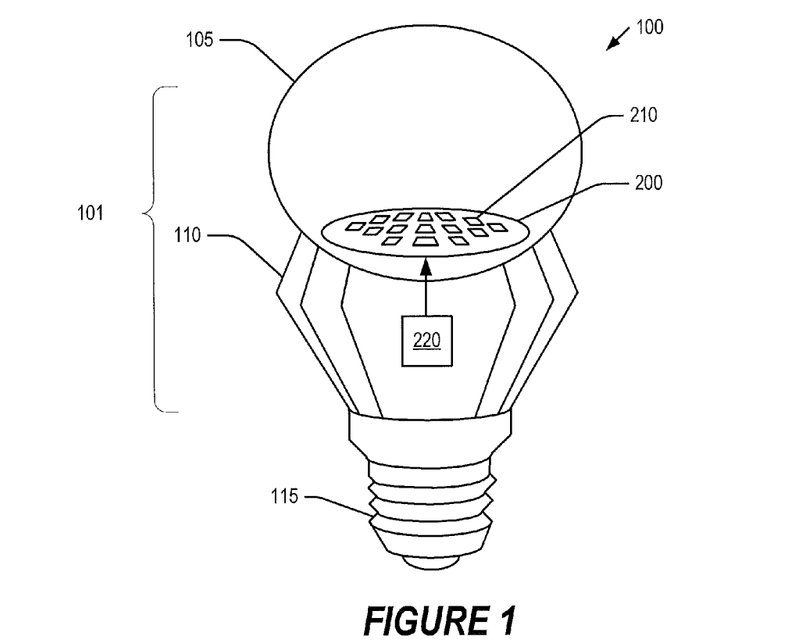
FIG. 1 is a cutaway view illustrating a lighting apparatus according to some embodiments of the present invention.

FIG. 1 illustrates a lighting apparatus 100 according to some embodiments of the present invention. Referring now to FIG. 1, the apparatus 100 includes a hollow diffuser lens or globe 105, a fin-shaped heat sink 110, and a base 115 that define a bulb-shaped housing 101. A lighting module 200 and a control circuit 220 are mounted within the housing 101. The lighting module 200 includes an array of solid state light emitting components, illustrated as LEDs 210, attached to a mounting plate 205. Although illustrated as having a circular shape, the mounting plate 205 may be provided in other shapes as well. Light is generated by the LEDs 210, which are arranged to collectively emit light towards the diffusing lens 105 mounted at the end of the housing 101. The LEDs 210 may be configured to emit light over different wavelength ranges, and may be selected so that a combined light output of the LEDs 210 defines an overall light emission for the apparatus 100 having a desired white point, correlated color temperature (CCT), color rendering index (CRI), and/or lumen output.

Still referring to FIG. 1, the lighting module 200 is configured to receive electrical current as one or more drive signals from the control circuit 220, such as an LED driver circuit, that is electrically coupled to the LEDs 210. The control circuit 220 is configured to operate the LEDs 210 by applying drive currents to individual LED chips in each LED 210. In some embodiments, the control circuit 220 may be configured to individually address each of the LEDs 210. For example, the control circuit 220 may include a current supply circuit configured to independently apply an on-state drive current to each of the individual LEDs 210 responsive to a control signal, and a control system configured to selectively provide the control signals to the current supply circuit. In other embodiments, the LEDs 210 may be serially connected, and the control circuit 220 may be configured to apply the on-state drive current to the string of LEDs 210.

The light fixture 100 is illustrated in FIG. 1 as a "bulb" that may be suitable for use in general illumination applications. However, it will be appreciated that embodiments of the present invention may include other lighting apparatus having different form factors. For example, a lighting apparatus according to some embodiments may have the shape of a "can" light, a pan or tray light, an automotive headlamp, or any other suitable form, in which the LEDs 210 may be arranged in a one-, two-, or three-dimensional array. Likewise, while illustrated in the form of fins, the heat sink 110 may be implemented in any form that is configured to spread, extract, and/or otherwise remove heat emitted by the lighting module 200. Also, while illustrated as being mounted within the housing 101, the control circuit 220 may or may not be included in the lighting apparatus 100 in some embodiments, for example, where the lighting apparatus 100 is provided to a device and/or system manufacturer that supplies its own driver circuit to be used in particular application and/or environment.

Figure 2:
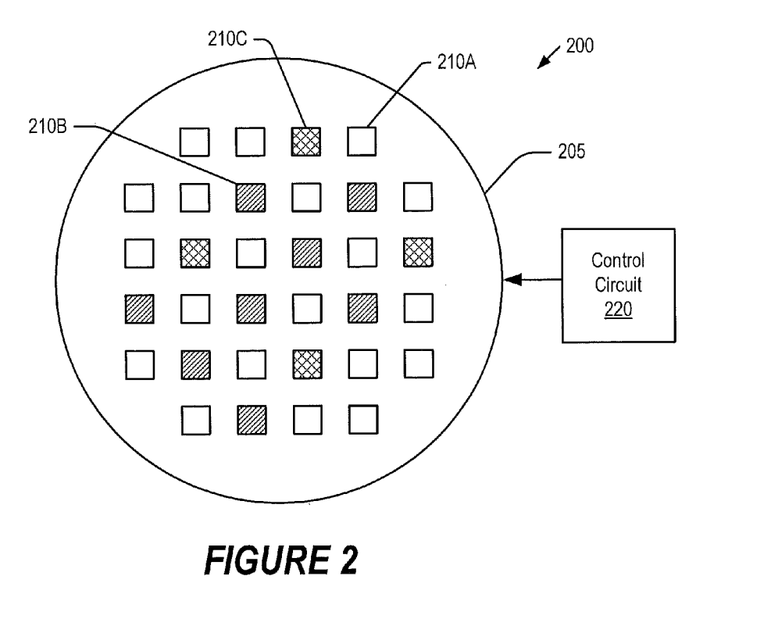
FIG. 2 is a top view illustrating a lighting module for use in a lighting apparatus according to some embodiments of the invention.

FIG. 2 is a top or plan view illustrating the lighting module 200 of FIG. 1 in greater detail. As shown in FIG. 2, the lighting module 200 includes a two-dimensional array of solid state light emitting devices 210 attached to the mounting plate 205. In particular, the lighting module 200 includes a plurality of light emitting devices (LEDs) including first LEDs 210A and second LEDs 210B configured to provide different emission characteristics. Quantities and chromaticities of the first and second LEDs 210A, 210B may be selected so that a combined light generated by a mixture of light from the first and second LEDs 210A, 210B provides a target chromaticity, which may for example be white For example, the first LEDs 210A may be blue shifted yellow (BSY) LEDs including a LED chip that emits light in the blue portion of the visible spectrum and a phosphor that responsively emits light in the yellow portion of the visible spectrum, and the second LEDs 210B may be red- or red-orange (RDO) LEDs including a LED chip (or a combination of an LED chip and a phosphor) that emits light in the red or red-orange portion of the visible spectrum. Also, as shown in FIG. 2, the first and second LEDs 210A, 210B are provided in a ratio of about 5:2. As such, the collective emission of the first and second LEDs 210A and 210B may provide the appearance of white light having a desired color point.

In addition, the lighting module 200 further includes at least one third LED 210C that emits light having a color point substantially similar to that of the combined light emitted by the first and second LEDS 210A and 210B. For example, the third LEDs 210C may be warm-white (WW) or neutral white (NW) LEDs respectively having a white point substantially similar to a desired white point provided by the combined output of the first and second LEDS 210A and 210B. In particular, where the collective light emission of the first and second LEDs 210A, 210B provides white light having a CCT of about 4000 K and a color coordinates of about (0.38, 0.37), the third LED 210C may be configured to also emit light having a CCT of about 4000 K and respective color coordinates (CCx, CCy) that are equal those of the collective light emission up to at least a first decimal place and/or fall within a 4-step MacAdam ellipse centered around a white point having a CCT of about 4000K on the black body locus. The addition of the third LEDs 210C may thereby increase an overall lumen output of the module 200 without substantially altering the color point of the combined light emitted by the first and second LEDs 210A and 210B, i.e., such that the overall color point of the module 200 remains equal up to at least the first decimal place and/or falls within the 4-step MacAdam ellipse centered around the desired white point. Although illustrated as including four (4) of the third LEDs 210C in the module 200 in FIG. 2, only one LED 210C may be included in some embodiments. More particularly, the number or quantity of the third LEDs 210C included in the module 200 may be selected to achieve a desired lumen output, and may be independent of a ratio of the first LEDs 210A to the second LEDs 210B.

In some embodiments, the third LEDs 210C may be implemented by a LED chip that emits light in the blue portion of the visible spectrum, and at least one phosphor that responsively emits light from about 570 nm to about 750 nm to provide the warm white light. For example, the third LEDs 210C may include the blue-emitting LED chip in combination with a first phosphor that responsively emits light in the yellow portion of the visible spectrum, and a second phosphor that responsively emits light in the red portion of the visible spectrum.

As such, the module 200 includes first LEDs 210A, second LEDs 210B, and third LEDs 210C, each of which is configured to provide different emission characteristics such that a combination of the light emitted by first, second, and third LEDs 210A, 210B, 210C provides warm white light for general illumination purposes. The warm white light provided by the module 200 may also have a CRI of greater than about 90 to approximate the behavior of an incandescent lamp, so that objects illuminated by the module 200 may appear more natural. In some embodiments, the individual emission of the third LEDs 210C may reduce the CRI of collective emission of the first and second LEDs 210A, 210B, but the overall CRI of the module 200 may remain greater than about 90.

The control circuit 220 is configured to provide a constant current source to drive the LEDs 210A, 210B, and 210C. In some embodiments, the first, second, and third LEDs 210A, 210B, 210C may be serially-connected in a single string. Also, in some embodiments, two or more of the LEDs 210A, 210B, and 210C may respectively include a blue-emitting LED chip having a similar forward voltage, but in combination with different phosphors. As LED chips formed in disparate material systems may react differently under various environmental parameters and/or may degrade at different rates over time, the use of similar LED chips in two or more of the LEDs 210A, 210B, and 210C may simplify the design of the control circuit 220. For example, the first LEDs 210A may be blue shifted yellow (BSY) LEDs that emit near-white light, the second LEDs 210B may be red-orange (RDO) LEDs that emit red and/or orange light, and the third LEDs 210C may be blue shifted yellow-red (BSYR) LEDs that emit warm white light in some embodiments. In some embodiments, the second LEDs 210B may be implemented using a blue LED in combination with a red phosphor and a color filter to provide the red light, as described in commonly assigned U.S. patent application Ser. No. 12/503,695 to LeToquin et al., entitled "SINGLE-COLOR WAVELENGTH-CONVERTED LIGHT EMITTING DEVICES," the disclosure of which is incorporated by reference herein.

Although not illustrated, a support member may be used to provide mechanical retention and/or thermal transfer to a surface on which the module 200 may be mounted. Other passive or active electronic components may be additionally mounted on the PCB and connected to serve a particular function. Such components can include resistors, diodes, capacitors, transistors, thermal sensors, optical sensors, amplifiers, microprocessors, drivers, digital communication devices, RF or IR receivers or transmitters and/or other components, for example. The module may include openings that may be covered by one or more optical elements and/or structures. For example, although not illustrated, such optical elements may include a simple transmissive diffuser, a surface embossed holographic diffuser, a brightness enhancing film (BEF), a Fresnel lens, TIR or other grooved sheet, a dual BEF (DBEF) or other polarizing film, a micro-lens array sheet, or other optical sheet. Reflective sheets, films, coatings and/or surfaces may also be provided in some embodiments.

Thus, as described above, the first LEDs 210A may be BSY LEDs configured to emit near white light, and the second LEDs 210B may be red LEDs configured to emit red light, such that the first and second LEDs 210A, 210B provide collective light emission that produces an appearance of warm white light having a desired color point. The third LEDs 210C may be warm white or neutral white LEDs configured to individually emit white light having a color point substantially similar to the collective emission of the first and second LEDs 210A, 210B to increase the overall lumen output of the module 200 without substantially altering the desired color point provided by the mixture of light from the first and second LEDs 210A, 210B.

The LEDs 210A, 210B, and 210C of the lighting module 200 illustrated in FIG. 2 may each include an LED chip enclosed in a package to provide environmental and/or mechanical protection, color selection, focusing and the like. An LED package may also include electrical leads, contacts, and/or traces for electrically connecting the LED package to an external circuit. The lighting module 200 as described herein may include multiple surface mount technology (SMT) packaged LEDs arranged in an array on the mounting plate 205, which may be a printed circuit board (PCB) such as a metal core PCB (MCPCB), a standard FR-4 PCB, or a flex PCB. The LEDs 210A, 210B, and 210C may include, for example, XLamp® brand packaged LEDs available from Cree, Inc., Durham, N.C.

Figure 3A:
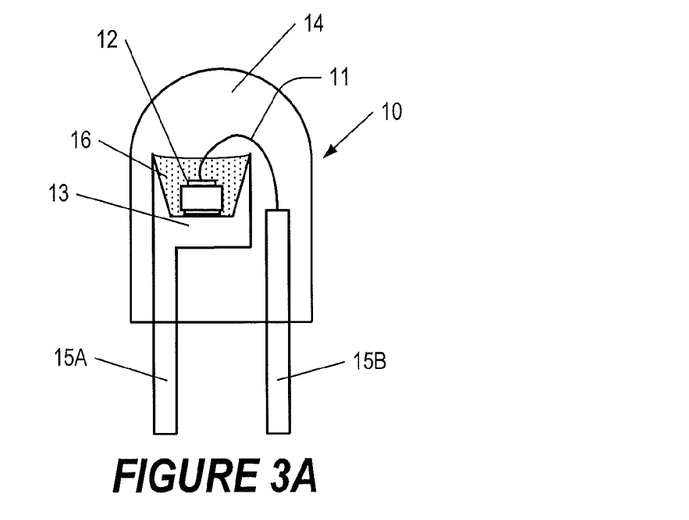
FIGS. 3A to 3C are cross-sectional side views illustrating examples of packaged light emitting devices for use in lighting modules according to some embodiments of the invention.
Figure 3B:
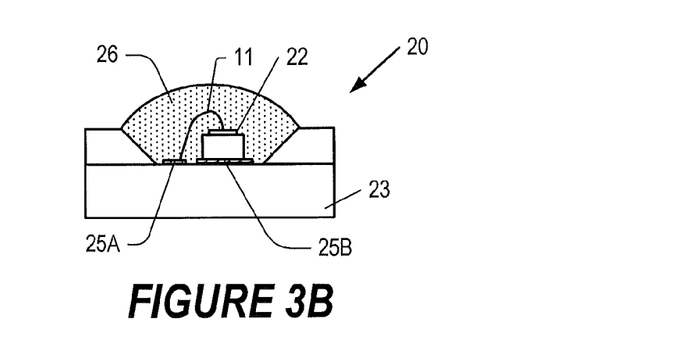
Figure 3C:
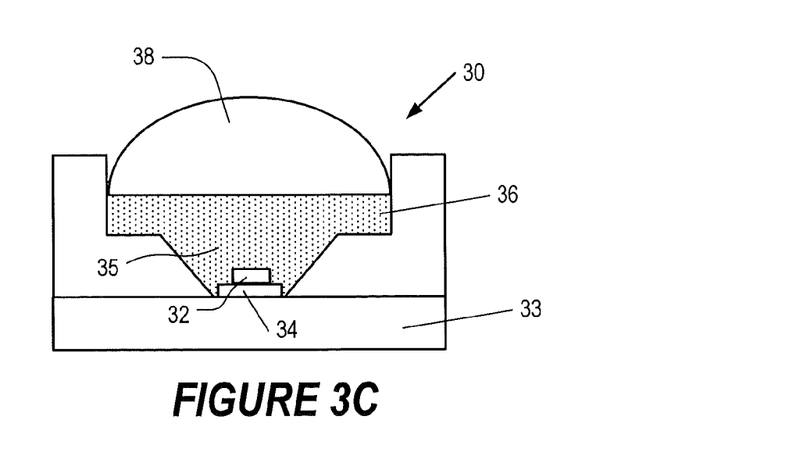

FIGS. 3A to 3C illustrate examples of LED packages that may be used to provide the LEDs 210 of FIGS. 1 and 2 according to some embodiments of the present invention. In particular, FIG. 3A illustrates an LED package 10 in which an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup may be filled with an encapsulant material 16 containing a wavelength conversion material, such as a phosphor. The entire assembly may be encapsulated in a clear protective resin 14, which may be molded in the shape of a lens to collimate the light emitted from the LED chip 12 and/or phosphor particles in the encapsulant material 16.

Still referring to FIG. 3A, at least some of the light emitted by the LED chip 12 over a first wavelength range (also referred to herein as "primary light") may be received by the phosphor, which may responsively emit light over a second wavelength range (also referred to herein as "secondary light"). The primary light emitted by the LED chip 12 may be partially or completely absorbed by the wavelength conversion material, such that the overall light output of the LED package 10 includes both the primary light emitted by the LED chip 12 and the secondary light emitted by the wavelength conversion material. The relative amounts of the primary and secondary light that are ultimately included in the overall light output of the LED package 10 may be varied based on the amount of primary light that is absorbed by the selected wavelength conversion material.

For example, the primary light emitted by the LED chip 12 may be within the blue portion of the visible spectrum (e.g., about 440 nm to about 470 nm), and the phosphor may be selected to partially absorb the primary light and generate secondary light in the yellow portion of the visible spectrum (e.g., about 570 nm to about 590 nm) in response to stimulation by the primary light to provide the BSY LEDs 210A of FIG. 2. As a further example, the primary light emitted by the LED chip 12 may be within the blue portion of the visible spectrum (e.g., about 440 nm to about 470 nm), and the encapsulant 16 may include a first phosphor selected to responsively generate secondary light in the yellow portion of the visible spectrum and a second phosphor selected to responsively generate light in the red and/or orange portion of the visible spectrum (e.g., about 585 nm to about 750 nm) to provide the BSYR LEDs 210C of FIG. 2.

Another LED package 20 according to some embodiments of the present invention is illustrated in FIG. 3B. The package of FIG. 3B may be more suited for high power operations which may generate more heat. In the LED package 20, an LED chip 22 is mounted onto a carrier, such as a printed circuit board (PCB) carrier 23. A metal reflector 24 mounted on the carrier 23 surrounds the LED chip 22 and reflects light emitted by the LED chip 22 away from the package 20. The metal reflector 24 is typically attached to the carrier 23 by means of a solder or epoxy bond. The reflector 24 also provides mechanical protection to the LED chip 22. One or more wirebond connections 11 are made between ohmic contacts on the LED chip 22 and electrical traces 25A, 25B on the carrier 23. The mounted LED chip 22 is covered with an encapsulant 26, which may provide environmental and/or mechanical protection to the chips while also acting as a lens. The encapsulant 26 includes at least one phosphor or other wavelength conversion material that absorbs at least some of the light emitted by the LED chip 22, and responsively emits light of a different wavelength.

Yet another LED package 30 according to some embodiments of the present invention is illustrated in FIG. 3C. As shown in FIG. 3C, an LED package 30 includes an LED chip 32 mounted on a submount 34 to a carrier substrate 33. The carrier substrate 33 can include an alumina substrate and/or a metal core PCB carrier substrate. A reflector 44 attached to the carrier substrate 33 surrounds the LED chip 32 and defines an optical cavity 35 above the LED chip(s) 32. An encapsulant material 36, such as silicone, fills the optical cavity 35. The encapsulant material 36 further includes at least one phosphor (or other wavelength conversion material) that is that absorbs at least some of the light emitted by the LED chip 32, and responsively emits light of a different wavelength. The reflector 44 reflects light emitted by the LED chip 32 away from the package 30. The reflector 44 also includes an upwardly extending cylindrical sidewall 45 that defines a channel in which a lens 38 can be inserted. The lens 38 may be held in place by the encapsulant material 36, and can move up and down as the encapsulant material 36 expands and contracts due to heat cycling. The lens 38 may include a light-scattering lens that is configured to refract light emitted by the LED and the wavelength conversion material. In some embodiments, the light scattering lens is configured to scatter the emitted light randomly. The light-scattering can include a transparent lens body including light scattering particles such as $TiO_2$, $Al_2O_3$, $SiO_2$, etc. in the lens body and/or the lens can include a roughened outer surface that can randomly scatter light that exits the lens 38.

Although example LED packages are discussed above with reference to FIGS. 3A to 3C, it will be understood that embodiments of the present invention are not limited to such packages.

Figure 4A:
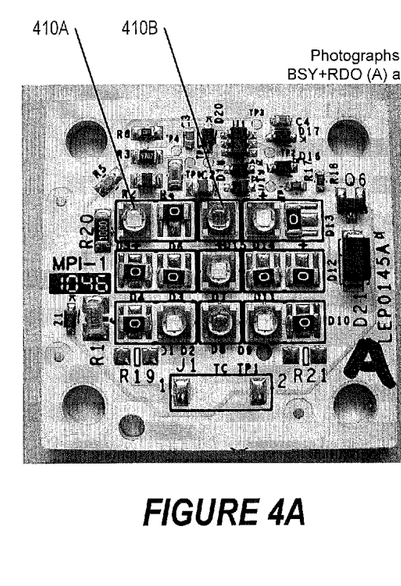
FIGS. 4A and 4B are photographs illustrating lighting modules according to some embodiments of the present invention.
Figure 4B:
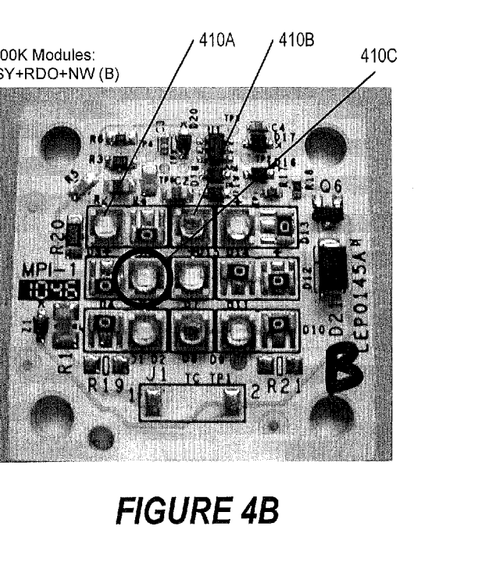

FIGS. 4A and 4B are photographs illustrating 4000 K lighting modules in plan view in accordance with some embodiments of the present invention. In particular, module A (at left) includes BSY LEDs 410A and RDO LEDs 410B that collectively emit white light having a CCT of about 4000K and a desired color point. Module B (at right) also includes the BSY LEDs 410A and RDO LEDs 410B, and further includes a NW LED 410C, which increases luminous flux of module B in comparison to that of module A while maintaining an overall light emission having a substantially similar color point. The inclusion of the NW LED 410C also alters the CRI of module B relative to that of module A. For example, the CRI of module B may be reduced relative to the CRI of module A due to the inclusion of the NW LED 410C. However, the CRI of module B may still be greater than about 85, and may even be greater than 90 in some embodiments. In other embodiments, the CRI of module B may be increased relative to that of module A due to the inclusion of the NW LED 410C.

As also shown in FIG. 4B, the NW LED 410C may be positioned diagonal to at least one RDO LED 410B in the module B to improve light mixing. While FIGS. 4A and B illustrate that the ratio of BSY LEDs 210A to RDO LEDs 210B in the modules A, B is about 5:2, it will be understood that the ratio may be adjusted to achieve a desired color point and/or CRI. For example, in some embodiments, a ratio of BSY LEDs 210A to RDO LEDs 210B of about 5:3 may be used. Also, while illustrated as including only a single NW LED 410C in module B, additional NW LEDs 410 may be included in some embodiments. The number or quantity of NW LEDs 410C included in module B may be independent of the ratio of BSY LEDs 410A to RDO LEDs 410B, but rather, may be selected to achieve a desired lumen output while maintaining the CRI of module B at or above a desired value.

The BSY, RDO, and NW LEDs 410A, 410B, 410C may be serially connected in some embodiments. A control circuit, such as the control circuit 220 of FIGS. 1 and 2, may also be provided to drive the LEDs 410A, 410B, 410C. Providing the BSY, RDO, and NW LEDs 410A, 410B, 410C all on a single, serially connected string may simplify the control circuitry. However, in other embodiments, some of the LEDs 410A, 410B, 410C may be connected in series (for example, LEDs of similar colors), and/or some of the LEDs 410A, 410B, 410C may be connected in parallel.

It will be understood that, although the example of FIGS. 4A-4B employ neutral white LEDs 410C to increase lumen output in a 4000K lighting module, embodiments of the present invention may be directed to modules that output white light at other color temperatures, and thus, may employ LEDs 410C having different characteristics. For example, in a 2700K lighting module, the LEDs 410C may be warm white LEDs configured to increase the lumen output of the module without substantially altering the color point. More generally, the white point and/or color temperature of the LEDs 410C may be selected in accordance with the desired light output for the overall lighting module so as to increase the lumen output of the module without substantially altering the color point provided by the mixture of light from the LEDs 410A and 410B.

Figure 5A:
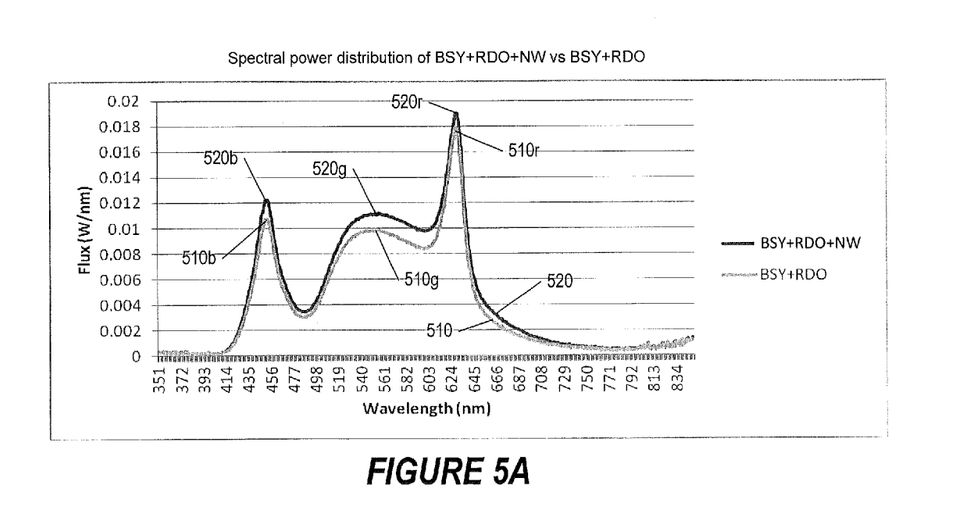
FIGS. 5A to 5E are graphs illustrating spectral power distributions of light emitting devices and lighting modules including such light emitting devices according to some embodiments of the present invention.

FIG. 5A is a graph illustrating differences in spectral power distributions of lighting module A including BSY and RDO LEDs 410A and 410B (shown by distribution 510) in comparison to lighting module B further including at least one NW LED 410C (shown by distribution 520). The data shown in FIG. 5A was obtained using the same power supply and optical set-up for both the BSY+RDO+NW lighting module B and the BSY+RDO lighting module A shown in FIG. 4. The LEDs were serially connected in a single string in both modules A and B. A constant current of about 440 milliamps (mA) was used to drive each of the LED strings, as a drive current of greater than about 450 mA may result in color shift parameters of the BSY and/or RDO LEDs. As shown in FIG. 5, the wavelengths of the light output of the BSY+RDO+NW lighting module B are substantially similar to that of the BSY+RDO lighting module A. However, the flux (in Watts per nanometer) was improved over the entire wavelength range for the BSY+RDO+NW lighting module B as compared to the BSY+RDO lighting module A.

In particular, the wavelength peaks 510b and 510g in distribution 510 provided by the BSY+RDO lighting module A may be attributed to the light output of the BSY LEDs 410A, while the peak 510r may be attributed to the light output of the RDO LEDs 410B. As shown in distribution 520 provided by the BSY+RDO+NW lighting module B, these wavelength peaks 510b, 510g, and 510r are substantially maintained (as shown by peaks 520b, 520g, and 520r), but with increased flux over the entire visible spectrum. Accordingly, the data shown in FIG. 5A illustrates that the addition of the NW LED 410C increases the flux of the overall light emission provided by module B, without substantially altering the color point provided by the mixture of light output from the BSY LEDs 410A and the RDO LEDs 410B.

Figure 5B:
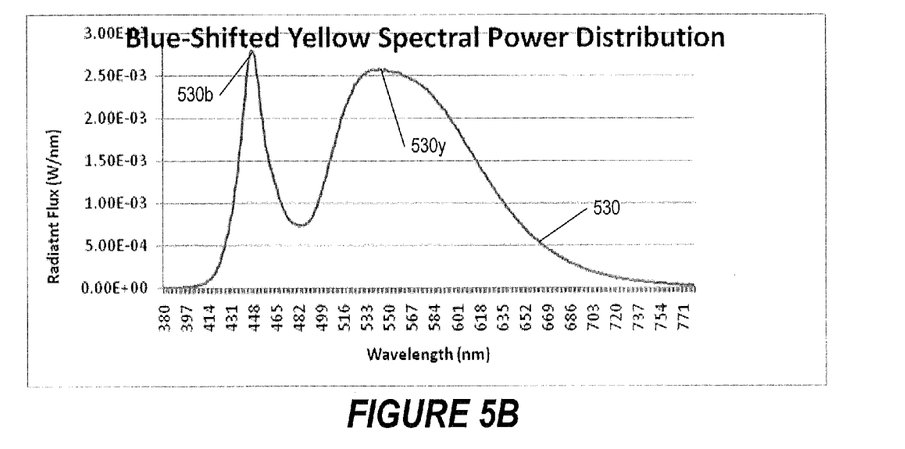

FIG. 5B is a graph illustrating the spectral power distribution of BSY LEDs 410A according to some embodiments. As shown in FIG. 5B, the BSY LEDs 410A each provide a spectral distribution 530 over a relatively wide portion of the visible spectrum, including a first peak 530b in the blue wavelength range and a second peak 530y in the yellow wavelength range. More particularly, the first peak 530b is provided between about 430 nanometers (nm) and about 455 nm, and the second peak 530y is provided between about 530 nm and about 565 nm, such that the emission of the BSY LEDs 410A provide an appearance of near-white light.

Figure 5C:
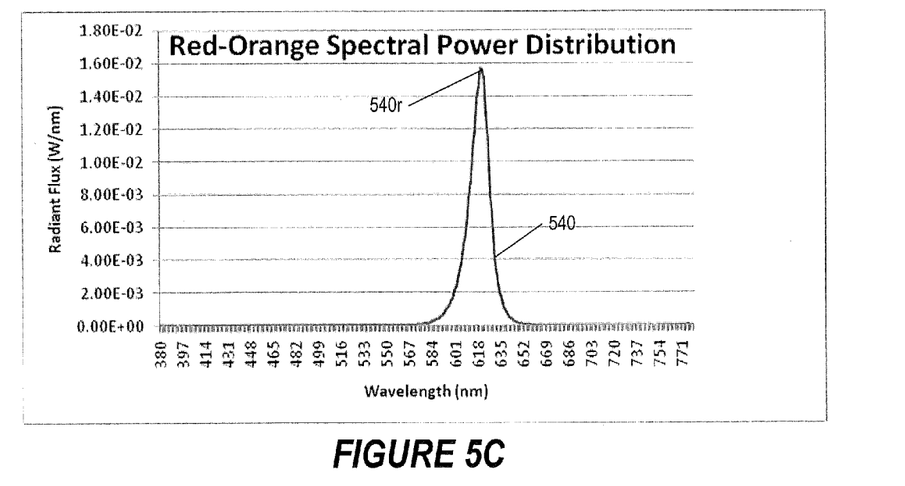

FIG. 5C is a graph illustrating the spectral power distribution of RDO LEDs 410B according to some embodiments. As shown in FIG. 5C, the RDO LEDs 410B each provide a spectral distribution 540 over a relatively narrow portion of the visible spectrum including a peak 540r in the red wavelength range. More particularly, the peak 540r is provided between about 610 nanometers (nm) and about 630 nm, such that the emission of the RDO LEDs 410B provide an appearance of red or red-orange light.

Figure 5D:
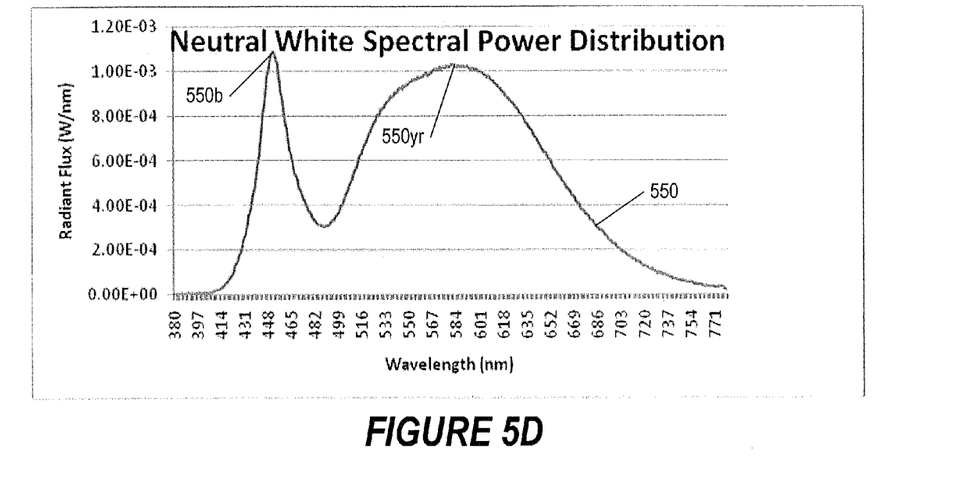
Figure 5E:
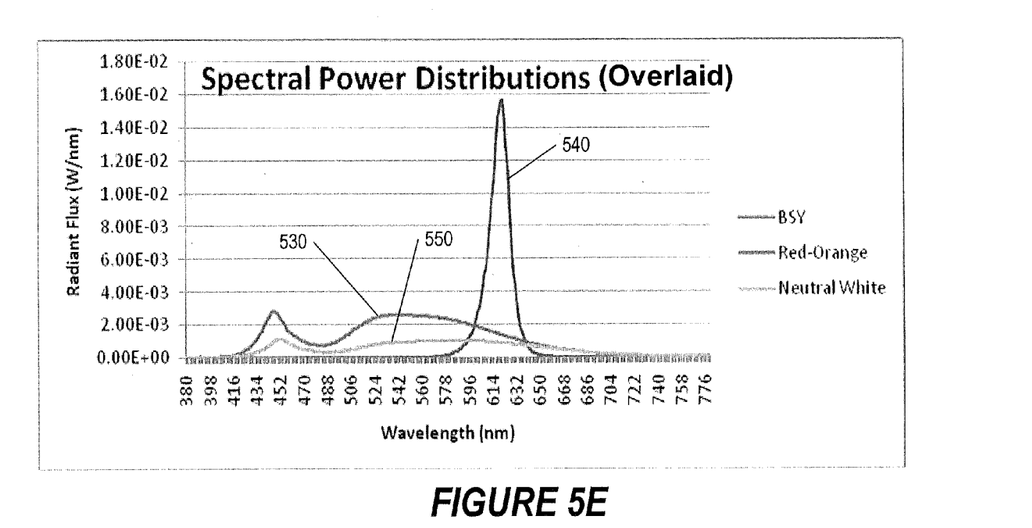

FIG. 5D is a graph illustrating the spectral power distribution of NW LEDs 410C according to some embodiments. As shown in FIG. 5D, the NW LEDs 410C each provide a spectral distribution 550 over a relatively wide portion of the visible spectrum, including a first peak 550b in the blue wavelength range and a second peak 550y in the yellow to red wavelength range. More particularly, the first peak 550b is provided between about 440 nanometers (nm) and about 460 nm, and the second peak 550yr is provided between about 560 nm and about 599 nm, such that the emission of the NW LEDs 410C provide an appearance of neutral-white light. The spectral power distributions 530, 540, and 550 of example BSY, RDO, and NW LEDs are illustrated overlaid on the same axes in FIG. 5E.

Figure 6:
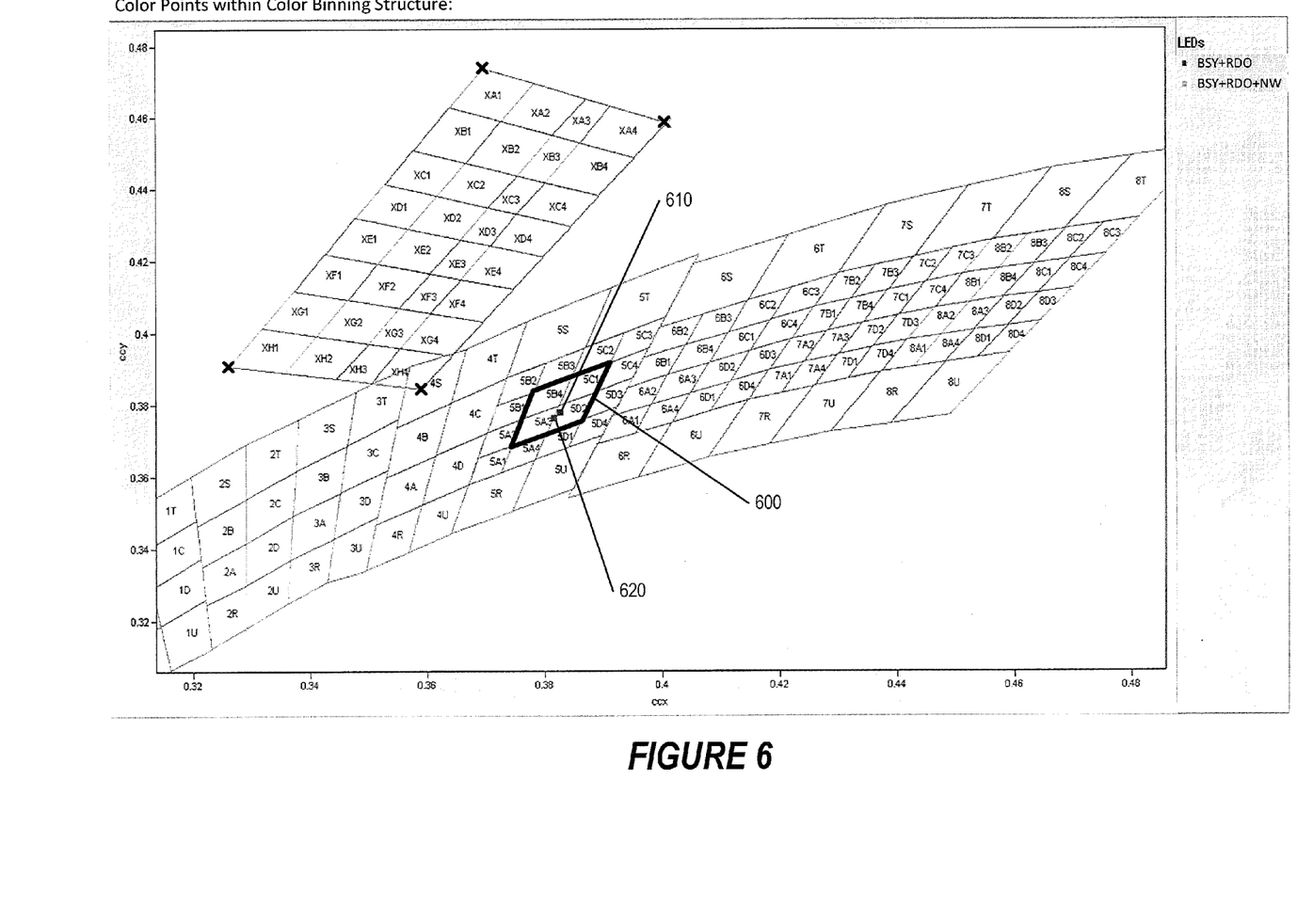
FIG. 6 is a chromaticity diagram illustrating a color binning structure according to some embodiments of the present invention.

FIG. 6 is a chromaticity diagram illustrating the color points of the lighting modules A and B in a color binning structure. One difficulty with solid state lighting modules that include multiple solid state devices is that the manufacturing process for LEDs typically results in variations between individual LEDs. Typically, LEDs are sorted into defined bins for manufacturing purposes based on the chromaticity of light emitted by the LEDs, in a process referred to as "binning," or grouping, the LEDs based on brightness, and/or color point. As used herein, a "bin" refers to a defined region of a chromaticity space. In this manner, each light emitting device may be characterized by x, y coordinates Emitters having similar x, y values may be grouped or binned to be used together, i.e., to be mounted together in a single LED package. The bins may be defined as quadrangles that encompass a MacAdam ellipse, which is an elliptical region encompassing chromaticity coordinates that are indistinguishable (to the average human eye) from the coordinates of the center of the elliptical region. Thus, LED lighting modules may utilize one bin of LEDs, or combine matched sets of LEDs from different bins, to achieve repeatable color points for the combined output of the LEDs.

As shown in FIG. 6, an example target chromaticity region for the lighting modules is defined by a quadrangle 600. The quadrangle 600 is defined by chromaticity coordinates (0.372, 0.366), (0.375, 0.380), (0.388, 0.390), and (0.384, 0.372), which encompass regions 5A3, 5B4, 5C1, and 5D2. The overall light emission from BSY+RDO lighting module A (shown by point 610) falls within the target chromaticity region 600, and has chromaticity coordinates of (0.3826, 0.3776). The overall light emission from the BSY+RDO+NW lighting module B (shown by point 620) likewise falls within the target chromaticity region 600, and has chromaticity coordinates of (0.3817, 0.3764). Thus, FIG. 6 illustrates that the addition of the NW LED 410C to module B substantially maintains the chromaticity coordinates provided by the collective light emission of the BSY LEDs 410A and the RDO LEDs 410B of module A, as their respective chromaticity coordinates differ only after the second decimal place (e.g., the respective x-color coordinates are equal up to at least the second decimal place, and the respective y-color coordinates are equal up to at least the second decimal place). However, it will be understood that color coordinates that are "substantially similar" or "substantially maintained" as described herein may be equal up to less than two decimal places, and more particularly, may fall within a 4-step MacAdam ellipse centered around a desired color point.

Still referring to FIG. 6, the color coordinates of light emitted by BSY LEDs according to some embodiments may fall within bins XA to XH, the boundaries of which are denoted in FIG. 6 as "X". In particular, the color coordinates listed below may define a quadrangle (not shown) on the chromaticity diagram of FIG. 6 in which the color coordinates of example BSY LEDs may be provided.

| Color Coordinates for BSY LEDs (in bins XA to XH): | |
|---|---|
| ccx | ccy |
| 0.3697 | 0.4738 |
| 0.4008 | 0.4584 |
| 0.359 | 0.3843 |
| 0.3263 | 0.3908 |

Also, the color coordinates of light individually emitted by example warm and neutral white LEDs according to some embodiments may be provided within the quadrangles (not shown in FIG. 6) defined by the color coordinates listed below.

| Color Coordinates for Warm White LEDs: | | |
|---|---|---|
| | ccx | ccy |
| 2700K: | 0.4473 | 0.4037 |
| | 0.4569 | 0.4000 |
| | 0.4684 | 0.4163 |
| | 0.4586 | 0.4203 |
| 3000K: | 0.4236 | 0.3969 |
| | 0.4334 | 0.3932 |
| | 0.4442 | 0.4093 |
| | 0.4342 | 0.4132 |
| 3500K: | 0.3974 | 0.3858 |
| | 0.4074 | 0.3823 |
| | 0.4174 | 0.3979 |
| | 0.4073 | 0.4016 |

| Color Coordinates for Neutral White LEDs: | | |
|---|---|---|
| | ccx | ccy |
| 4000K: | 0.3722 | 0.3739 |
| | 0.3822 | 0.3706 |
| | 0.3915 | 0.3857 |
| | 0.3813 | 0.3892 |

Table 1 illustrates optical results for both the BSY+RDO+NW lighting module B and the BSY+RDO lighting module A of FIGS. 4A-4B under similar conditions, where both had a warm up time of about 10 minutes.

TABLE 1

| LEDs | Power (W) | Lf (lm) | CCx | CCy | CCT (K) | CRI | Efficacy (lm/W) |
|---|---|---|---|---|---|---|---|
| BSY + RDO + NW | 10.719 | 726.00 | 0.3817 | 0.3764 | 3961.5 | 90 | 67.73 |
| BSY + RDO | 9.682 | 641.30 | 0.3826 | 0.3776 | 3945.6 | 90.8 | 66.24 |

As shown in Table 1, the addition of the NW LED 410C provides significant improvements in luminous flux (Lf) as well as improved luminous efficacy, while substantially maintaining the color point (CCx, CCy) and the correlated color temperature (CCT), and while only slightly reducing the color rendering index (CRI). In particular, as shown in Table 1, the respective color coordinates defining the overall emission of the BSY+RDO+NW module B are equal to those of the BSY+RDO module A up to at least a second decimal place. It should be noted that increasing the drive current to greater than about 450 mA may result in color shift parameters of the BSY LEDs 410A and/or RDO LEDs 410B. With this constraint, simply increasing the drive current of the BSY and/or RDO LEDs may be insufficient to achieve a desired lumen output of more than about 700 lumens (lm). However, the individual emission of the NW LED 410C achieves a lumen output in excess of 700 lm without substantially altering the color point CCx, CCy provided by the collective emission of the BSY LEDs 410A and the RDO LEDs 410B.

Accordingly, lighting modules according to some embodiments of the present invention may include a plurality of near-white light emitters (for example, BSY LEDs) in combination with one or more light emitter that has a chromaticity that falls within a non-white chromaticity region (for example, RDO LEDs), as well as at least one light emitter that has a chromaticity within a neural- or warm-white chromaticity region (for example, a NW or WW LED). Light from the near-white light emitters may combine with light from the non-white light emitters and light from the neutral- or warm-white light emitters to produce a combined light output that substantially maintains the chromaticity of the combined emission of the near-white and non-white emitters, while simultaneously increasing the lumen output. For example, the neutral- or warm-white emitter may have a chromaticity substantially similar to the combined emission of the near-white and non-white emitters in some embodiments.

Embodiments of the present invention may be used to create high-efficacy LED solutions with high CRIs over a wide range of correlated color temperatures (CCTs). In particular, embodiments of the present invention may be used to expand lighting module products to provide a greater range of color temperatures and/or higher luminous flux values, while maintaining a CRI of greater than about 90 in the product specifications. Embodiments of the present invention may also be used to expand and increase the possible luminous flux values and color points that may be provided by solid state lighting modules, which were previously limited by the particular BSY to RDO ratios required to achieve a desired color point. Also, multiple warm white and/or neutral white LEDs may be used as higher luminous flux specifications are desired.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

That which is claimed:

1. A lighting module, comprising:
 a plurality of solid state light emitting components configured to provide collective light emission having first and second characteristics; and
 at least one additional solid state light emitting component configured to provide individual light emission over a wavelength range different than that of respective ones of the plurality of solid state light emitting components, wherein the individual light emission in combination with the collective light emission defines an overall light emission of the module in which the second characteristic is reduced while the first characteristic is substantially maintained wherein the first characteristic comprises a desired color point, and wherein the second characteristic comprises a color rendering index (CRI).

2. The module of claim 1, wherein the individual light emission has a color point that is substantially similar to the desired color point.

3. The module of claim 2, wherein the desired color point comprises a white point on a Planckian locus having a correlated color temperature between about 2600 K and about 6500 K.

4. The module of claim 3, wherein respective color coordinates defining a white point of the overall light emission fall within a 4-step MacAdam ellipse centered around the desired white point.

5. The module of claim 2, wherein a color rendering index (CRI) of the collective light emission is greater than about 90, and wherein a CRI of the overall light emission is less than the CRI of the collective light emission.

6. The module of claim 5, wherein:
 the plurality of solid state light emitting components comprises first and second light emitting devices configured to provide light emission over different first and second wavelength ranges, respectively; and
 the additional solid state light emitting component comprises a third light emitting device configured to provide the individual light emission over a third wavelength range different than the first and second wavelength ranges.

7. The module of claim 6, wherein the first light emitting device is a blue shifted yellow light emitting device, wherein the second light emitting device is a red light emitting device, and wherein the third light emitting device is a warm-white or neutral-white light emitting device.

8. The module of claim 7, wherein the third light emitting device comprises a blue-emitting LED and at least one wavelength conversion material that emits light having a wavelength within the yellow to red portions of a visible spectrum.

9. The module of claim 7, wherein the third light emitting device is a neutral-white light emitting device, and wherein the individual light emission defines a spectral distribution having a first peak wavelength between about 440 nanometers (nm) and 460 nm, and a second peak wavelength between about 560 nm and about 599 nm.

10. The module of claim 7, wherein the third light emitting device is a warm-white light emitting device, and wherein the individual light emission defines a spectral distribution having a first peak wavelength between about 445 nanometers (nm) and 460 nm, and a second peak wavelength between about 580 nm and about 620 nm.

11. The module of claim 7, wherein the third light emitting device is positioned in the module substantially diagonal to the second light emitting device in plan view.

12. The module of claim 7, wherein a ratio of the first light emitting device to the second light emitting device included in the module is about 5:2 or about 5:3.

13. The module of claim 12, wherein a quantity of the third light emitting device included in the module is independent of the ratio of the first emitting device to the second light emitting device.

14. The module of claim 1, wherein the plurality of solid state light emitting components and the at least one additional solid state light emitting component are serially connected in a string, and are controlled by constant current supplied by a control circuit.

15. A lighting apparatus, comprising:
 a plurality of solid state light emitting components configured to collectively emit light having a desired white point and a color rendering index (CRI) of greater than about 90; and
 at least one additional solid state light emitting component configured to individually emit light having a white point substantially similar to the desired white point, wherein a CRI of an overall light emission of the apparatus is less than the CRI of the light collectively emitted by the plurality of solid state light emitting components.

16. The apparatus of claim 15, wherein the light individually emitted by the additional solid state light emitting component in combination with the light collectively emitted by the plurality of solid state light emitting components defines an overall light emission of the apparatus having an increased lumen output as compared to the light collectively emitted by the plurality of solid state light emitting components without substantially altering the desired white point.

17. The apparatus of claim 16, wherein the overall light emission of the apparatus defines a white point having respective color coordinates that fall within a 4-step MacAdam ellipse centered around the desired white point.

18. The apparatus of claim 15, wherein the white point of the additional solid state lighting component has a correlated color temperature between 2600K and 6500K.

19. The apparatus of claim 15, wherein the CRI of the overall light emission of the apparatus is greater than about 90.

20. The apparatus of claim 19, wherein the plurality of solid state light emitting components comprises at least one blue shifted-yellow light emitting device and at least one a red-orange light emitting device, and wherein the additional solid state light emitting component comprises a warm-white or neutral-white light emitting device.

21. The apparatus of claim 20, wherein a ratio of the blue shifted yellow to red-orange light emitting devices is about 5:2 or about 5:3.

22. A lighting apparatus, comprising:
a plurality of solid state light emitting components configured to provide collective light emission having a desired white point and comprising first and second solid state light emitting components configured to provide respective light emission over different wavelength ranges; and
at least one third solid state light emitting component configured to provide individual light emission over a wavelength range different than those of the first and second light emitting components in combination with the collective light emission to increase an overall lumen output and reduce a color rendering index (CRI) of the lighting apparatus relative to the collective light emission without substantially altering the desired white point.

23. The apparatus of claim 22, wherein the individual light emission has a white point that is substantially similar to the desired white point.

24. The apparatus of claim 23, wherein the desired white point has a correlated color temperature between about 2600 K and about 6500 K.

25. The apparatus of claim 22, wherein the collective light emission has a color rendering index (CRI) of greater than about 90.

26. The apparatus of claim 25, wherein the CRI of the lighting apparatus is greater than about 90.

27. A lighting module, comprising;
a plurality of light emitting devices comprising blue shifted yellow light emitting devices and red light emitting devices configured to collectively emit light having a desired white point; and
at least one warm-white or neutral-white light emitting device comprising a blue shifted yellow light emitting device in combination with a phosphor configured to individually emit light having a white point substantially similar to the desired white point to increase a luminous flux of an overall light output of the lighting module without substantially altering the desired white point wherein a color rendering index (CRI) of the overall light output of the module is less than a CRI of the light collectively emitted by the plurality of light emitting devices comprising the blue shifted yellow light emitting devices and red light emitting devices.

28. The module of claim 27, wherein a ratio of the blue shifted yellow light emitting devices to the red light emitting devices is about 5:2 or about 5:3, and wherein the CRI of the overall light output of the module is greater than about 90.

* * * * *